United States Patent [19]

Kinoshita et al.

[11] Patent Number: 4,974,053
[45] Date of Patent: Nov. 27, 1990

[54] SEMICONDUCTOR DEVICE FOR MULTIPLE PACKAGING CONFIGURATIONS

[75] Inventors: Mitsuya Kinoshita; Tadato Yamagata; Hiroshi Miyamoto, all of Itami, Japan

[73] Assignee: Mitsubishi Denki Kabushiki Kaisha, Japan

[21] Appl. No.: 331,358

[22] Filed: Mar. 31, 1989

[30] Foreign Application Priority Data

Oct. 6, 1988 [JP] Japan ................. 63-252318

[51] Int. Cl.⁵ ............... H01L 21/60; H01L 23/48
[52] U.S. Cl. ........................ 357/68; 357/70; 357/74
[58] Field of Search ............... 357/74, 68

[56] References Cited

U.S. PATENT DOCUMENTS

| 4,575,748 | 3/1986 | Terui et al. ............... 357/74 |
| 4,578,697 | 3/1986 | Takemae ................... 357/74 |
| 4,789,889 | 12/1988 | Morris et al. ............. 357/69 |

FOREIGN PATENT DOCUMENTS

| 0221496 | 5/1987 | European Pat. Off. . |
| 60-9134 | 1/1985 | Japan . |
| 60-10651 | 1/1985 | Japan ................. 357/74 |
| 60-46041 | 3/1985 | Japan . |
| 60-98652 | 6/1985 | Japan ................. 357/74 |
| 60-198835 | 10/1985 | Japan . |
| 60-32534 | 2/1986 | Japan ................. 357/70 |
| 62-42552 | 2/1987 | Japan ................. 357/74 |
| 61-81741 | 4/1987 | Japan . |
| 62-114256 | 5/1987 | Japan . |
| 62-122139 | 6/1987 | Japan . |
| 62-244144 | 10/1987 | Japan . |
| 1-80054 | 3/1989 | Japan . |
| 1-81253 | 3/1989 | Japan . |

Primary Examiner—Andrew J. James
Assistant Examiner—Viet Q. Nguyen
Attorney, Agent, or Firm—Leydig, Voit & Mayer

[57] ABSTRACT

A semiconductor device having a bonding pad arrangement adaptable both to a package specification which requires lead terminals only along one longitudinal side of the package and to a specification which requires lead terminals to be arranged on both longitudinal sides of the package. The semiconductor device has a semiconductor substrate, a circuit formed on the semiconductor substrate, first and second groups of bonding pads respectively arranged along a first pair of two opposing sides of the semiconductor substrate, and third and fourth groups of bonding pads respectively arranged along a second pair of two opposing sides of the semiconductor substrate, the bonding pads of the first group being electrically connected to the circuit, each of the bonding pads of the third and fourth groups being employed for the same signal as a corresponding bonding pad of the second group, the bonding pads of the second group and the bonding pads of the third and fourth groups being selectively connectable to the circuit electrically.

5 Claims, 16 Drawing Sheets

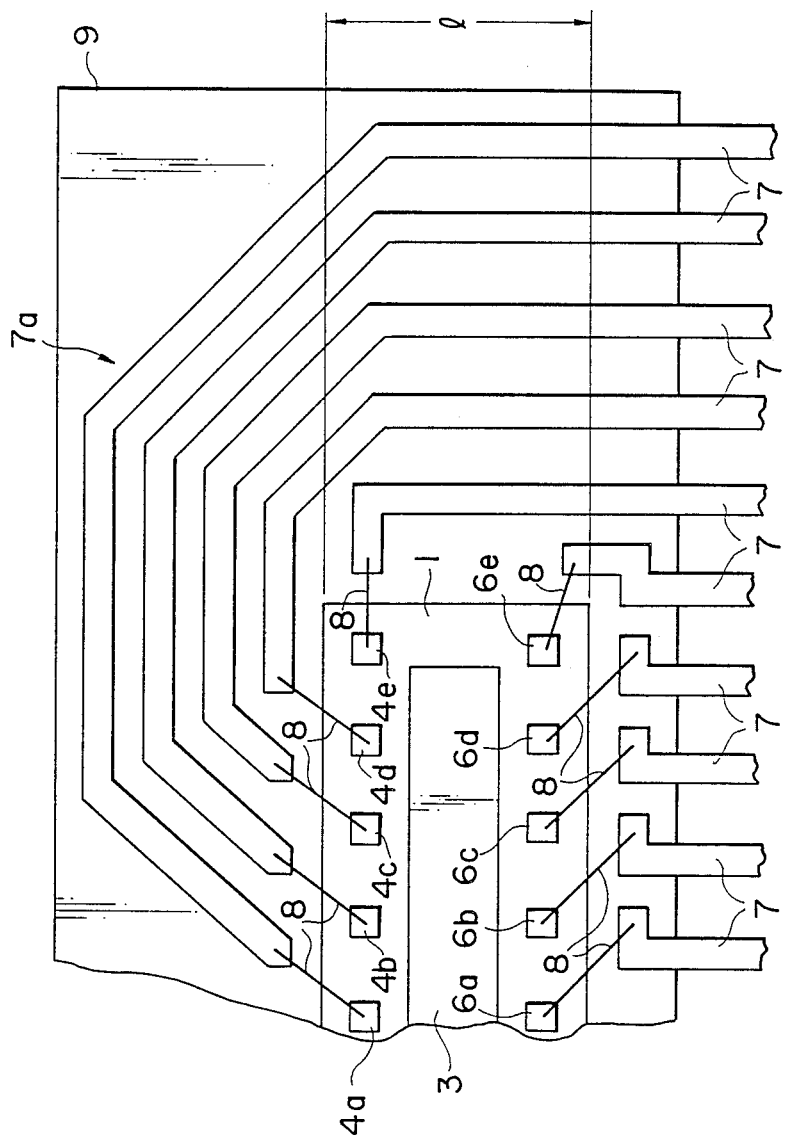
FIG. IC PRIOR ART

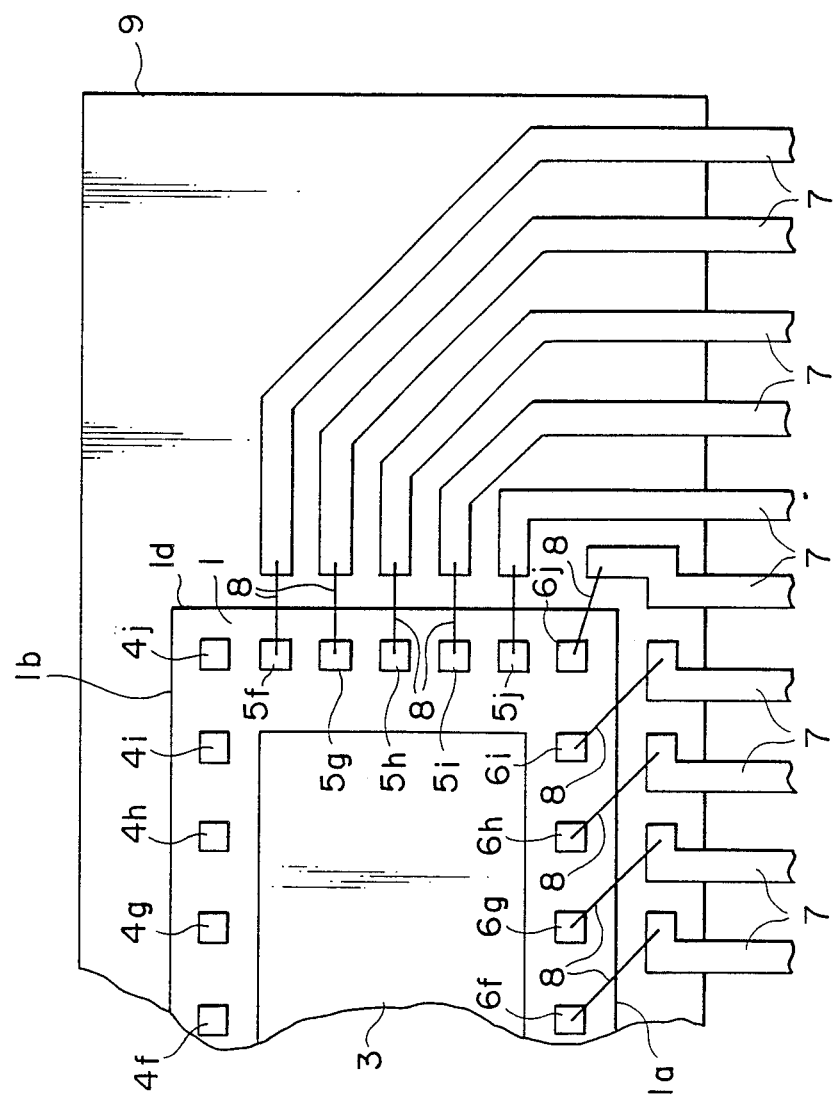

SEMICONDUCTOR DEVICE FOR MULTIPLE PACKAGING CONFIGURATIONS

BACKGROUND OF THE INVENTION

1. Field of the Invention

The present invention relates to a semiconductor device. More particularly, the present invention relates to a semiconductor device incorporating a bonding pad arrangement which is suited both to a package specification which requires lead terminals to be provided only on one side of a package and to a package specification which requires the lead terminals to be provided on both of two opposing sides of a package.

2. Description of the Related Art

FIG. 1A shows a known semiconductor device which was reported at the Spring Meeting of 1988 All Japan Conference of Electro-Communication Engineering. This semiconductor device has a semiconductor substrate 1 which is provided with a plurality of bonding pads B arranged along both longitudinal sides thereof. Numeral 3 denotes a plurality of circuit regions provided on the semiconductor substrate 1. FIG. 1B is a fragmentary plan view of the semiconductor substrate 1, having the bonding pads arranged along longitudinal sides thereof, mounted on a 20-pin SOJ (Small Outline J-leaded Package), while Fig 1C shows the same semiconductor substrate 1 mounted on a 20-pin ZIP (Zig-zag In-line Package). In case of a 4M-bit dynamic RAM, a specification requires that the width W of the 20-pin SOJ 2 is 350 mil, i.e., about 8.9mm as shown in FIG. 2A, and that the height H of the 20-pin ZIP 9 is 400 mil, i.e., about 10.16 mm, as shown in FIG. 2B.

Referring to FIG. 1B, the bonding pads 4a to 4e and 6a to 6e of the semiconductor substrate 1 mounted on the SOJ 2 are connected to leads 7 formed on the package, through bonding wires 8. In this case, the semiconductor substrate 1 can be received in the SOJ 2 of the described specification without difficulty.

In the case of the package shown in FIG. 1C, however, it is necessary that the elongated leads 7a to be connected with the bonding pads 4a to 4e be provided along that longitudinal side of the ZIP 9 where no lead is led out therefrom. Since the size of the package is predetermined as stated above, the length l of the shorter sides of the rectangular semiconductor substrate 1 must be undesirably reduced in order to provide a sufficient area for arrangement of the elongated leads 7a. For instance, in the case of a 4M-bit dynamic RAM, it is necessary that a capacitor having a capacitance of at least 30 femtofarad be provided in each memory cell in order to eliminate troubles such as a soft error thereby attaining high reliability. For this reason, the memory cell is required to have a size which is about 5 $\mu$m in length and about 2 $\mu$m in width. Under the conditions were the length l of the shorter sides of the semiconductor substrate 1 is restricted, the width, i.e., the length of shorter sides, of the memory cell is further restricted with the result that a high precision processing is required.

In order to overcome the above-described problems shown in FIG. 1, a semiconductor device has been proposed in which at least two bonding pads for the same signal are provided on the periphery of a semiconductor substrate 1 in a spaced relation, as shown in FIG. 3A. More specifically, referring to this Figure, a first bonding pad 10a for a signal A0, a bonding pad 10b for a signal A1, a bonding pad 10c for a signal A2, and other bonding pads are arranged along a shorter side of the semiconductor substrate 1 at a suitable interval. In addition, a second bonding pad 10d for the signal A0 is provided on the longitudinal side of the semiconductor substrate 1. The first bonding pad 10a for the signal A0 and the second bonding pad 10d for the same signal A0 are connected to each other through internal wiring 11. The point of connection between the first and second bonding pads 10a and 10d is connected to a buffer circuit 12 provided on the semiconductor substrate 1.

FIG. 3B is a fragmentary plan view of an arrangement in which the semiconductor device 1 of FIG. 3A is encapsulated in a ceramic package 13. Terminals such as a terminal 14a for a signal A0, a terminal 14b for a signal A1, a terminal 14c for a signal A2 and other terminals are arranged along a shorter side of the ceramics package 13 at suitable intervals. The first bonding pad 10a for the signal A0 is connected to the terminal 14a through a bonding wire 15a. Similarly, bonding wires 15b and 15c are used for providing connection between the bonding pads 10b, 10c for the signals A1, A2 and corresponding terminals 14b and 14c. Thus, only the first bonding pad 10a for the signal A0 is used for the receiving of the signal A0, while the second bonding pad 10d for the signal A0 is not used. The terminals 14a, 14b and 14c for the signals A0, A1 and A2 are respectively connected to pins (not shown) which are exposed on the outer surface of the ceramics package 13 for receiving external signals.

FIG. 3C is a fragmentary plan view showing the structure obtained by encapsulating the semiconductor device of FIG. 3A in a plastic molded package 20. Terminals such as a terminal 16a for a signal A0, a terminal 16b for a signal A1, a terminal 16c for a signal A2 are arranged at suitable intervals on the plastic molded package 20 surrounding the semiconductor substrate 1. The second bonding pad 10d for the signal A0 is connected to the terminal 16a through a bonding wire 15a. Similarly, bonding wires 15b and 15c are used to provide respective connections between the bonding pads 10b, 10c for the signals A1, A2 and corresponding terminals 16b, 16c. In this case, second bonding pad 10d for the signal A0 is used for receiving the signal A0, and the first bonding pad 10a for the signal A0 does not take part in receiving that signal. The terminals 16a, 16b and 16c are connected to pins which are exposed on the outer surface of the plastic mold package 20 for receiving external signals.

In each of the arrangements shown in FIGS. 3A and 3B, one of two bonding pads for the same signal is selectively used according to the type of the package in which the semiconductor substrate is encapsulated, thus offering an advantage that the wire bonding between the bonding pads on the semiconductor substrate and the corresponding terminals on the package is facilitated.

The semiconductor device of the type described encounters a problem in that, since a pair of bonding pads for the same signal are always connected with each other for the external signal A0, the input capacity of the semiconductor device as viewed from the external signal input pin is increased, often to exceed the allowable limit. A semiconductor device disclosed in Japanese Published Patent Application No. 62-244144 has been proposed for the purpose of overcoming the above-described problem. Referring to FIG. 4 which is a circuit diagram showing the construction of this semiconductor device, a semiconductor substrate 1 carries first and second bonding pads 10a and 10d for the signal A0, an internal buffer circuit 12, a bonding pad 30 for a power supply, a bonding pad 31 for switching and a switch circuit 39. The bonding pad 30 for power supply is bonded to a power supply terminal (not shown) of a voltage Vcc which is provided on the package at the time of packaging of the semiconductor substrate 1 and the bonding pad 31 for switching is disposed in the vicinity of the bonding pad 30 for power supply. The switch circuit 39 includes an N-channel MOS transistor 34, inverters 32, 33, P-channel MOS transistors 35, 38, and N-channel MOS transistors 36, 37.

The operation of this semiconductor device is as follows. In the case where the power supply terminal on the package is not connected to the bonding pad 31 for switching, a node A is always held at the ground potential, i.e., at a low level, because the N channel MOS transistor 34 conducts. For the same reason, nodes B and C are maintained at high and low levels, respectively. Therefore, the P-channel MOS transistor 35 and the N-channel MOS transistor 36 become conductive, while the N-input channel MOS transistor 37 and the P-channel MOS transistor 38 become non-conductive, so that the first bonding pad 10a for the signal A0 is connected to the internal buffer circuit 12, while the second bonding pad 10d is separated from the internal buffer circuit 12.

On the other hand, in the case where the power supply terminal on the package is bonded to the bonding pad 30 for a power supply by means of a bonding wire 41 and also to the bonding pad 31 for switching through a bonding wire 42, the node A is forcibly set at a high level, while the node B and the node C are set to low and high levels, respectively. In consequence, the P-channel MOS transistor 35 and the N-channel MOS transistor 36 becomes non-conductive, while the N-channel MOS transistor 37 and the P-channel MOS transistor 38 become conductive, with the result that the first bonding pad 10a for the signal A0 is isolated from the internal buffer circuit 12 while the second bonding pad 10d for the signal A0 is connected to the internal buffer circuit 12.

Thus, only one of the first and second bonding pads 10a and 10d for the signal A0 is selectively connected to the internal buffer circuit 12, while the other bonding pad is isolated from the internal buffer circuit 12, depending on whether the power supply terminal on the package is connected to the bonding pad 31 for switching. With the arrangement shown in FIG. 4, therefore, despite the fact that a pair of bonding pads are provided on the semiconductor substrate 1 for the same signal, the input capacity as viewed from the external signal input pin can be reduced almost to the same level as that obtained when only one bonding pad for the external signal is provided on the semiconductor substrate 1.

FIG. 5A shows a 4M-bit dynamic RAM as an example of a semiconductor memory device which incorporates a bonding pad change-over means of the type described hereinabove. This 4M-bit dynamic RAM can be used either as a dynamic RAM of 4 M words×1 bit type or a dynamic RAM of 1 M words×4 bits type. The switching between these two modes is effected depending upon, for example, whether or not a signal is input to a bonding pad for switching (not shown).

Arrangements obtained by mounting the semiconductor substrate 1 on an SOJ 2 in both of these two modes are respectively shown in FIGS. 5B and 5C.

More specifically, FIG. 5B shows an arrangement in which the semiconductor device is used as a dynamic RAM of 4 M words×1 bit type, while FIG. 5C shows an arrangement in which the semiconductor device is used as a dynamic RAM of 1 M words ×4 bits type.

In each of the arrangements shown in FIGS. 5B and 5C, the design is such that bonding pads A9a and A9b receive the same signal and switching means of the type explained in connection with FIG. 4 is used to realize either the arrangement of FIG. 5B in which the bonding pad A9b is used for the connection or the arrangement of FIG. 5C in which the bonding pad A9a is used for the connection. Unfortunately, however, the arrangements of the type described in connection with FIGS. 5A to 5C cannot give a satisfactory solution to, the problem explained before in connection with FIG. 1C, i.e., the undesirable restriction on the area of the semiconductor substrate 1 encountered when the semiconductor substrate 1 is packaged in a ZIP.

FIG. 6A shows another known semiconductor substrate 1 which disclosed in Japanese Published Patent Application No. 62-122139. Referring to this Figure, bonding pads 50a and 50b correspond to one signal, while bonding pads 51a and 51b correspond to another signal. One of the bonding pads 50a and 50b and one of the bonding pads 51a and 51b are selected by switching means of the type shown in FIG. 4. FIGS. 6B and 6C show arrangements which are obtained by packaging the semiconductor substrate 1 of FIG. 6A in a ZIP 9 and in a DIP (Dual In-line Package) 53, respectively. As will be understood from these Figures, the semiconductor substrate 1 of the type shown in FIG. 6A is suitable for packaging in a ZIP or a DIP, but is not suitable for packaging in an SOJ. Namely, as shown in FIG. 6D, when the semiconductor substrate of the type shown in FIG. 6A is packaged in an SOJ 2, the area of the semiconductor substrate 1 is undesirably restricted since the areas each having a length d sufficient to arrange elongated leads 7a are required in both ends of the package. As a result extremely precise and delicate processing is required.

SUMMARY OF THE INVENTION

In view of the above-described problems of related arts, an object of the present invention is to provide a semiconductor device which is suited both to a package specification requiring lead terminals to be provided only on one side of a package and to a package specification requiring lead terminals to be provided on both of opposing sides of a package, and in which restriction on the area of the semiconductor substrate is substantially reduced to facilitate mounting of a greater number of elements on the semiconductor substrate than before.

To this end, according to the present invention, there is provided a semiconductor device comprising: a semiconductor substrate having a first pair of two opposing sides and a second pair of two opposing sides; a circuit formed on the semiconductor substrate; first and second groups of bonding pads respectively arranged along the first pair of two opposing sides of the semiconductor substrate; and third and fourth groups of bonding pads respectively arranged along the second pair of two opposing sides of the semiconductor substrate, the bonding pads of the first group being electrically connected to the circuit, each of the bonding pads of the third and fourth groups being for the same signal as the corresponding bonding pad of the second group, the bonding pads of the second group and the bonding pads of the third and fourth groups being selectively connected to the circuit electrically.

BRIEF DESCRIPTION OF THE DRAWINGS

FIGS. 1B and 1C are fragmentary plan views of arrangements obtained by packaging the semiconductor device of FIG. 1A on an SOJ and a ZIP, respectively;

FIGS. 9A and 9B are fragmentary plan views of arrangements obtained by packaging the semiconductor device of FIG. 7 in an SOJ and a ZIP, respectively.

DESCRIPTION OF THE PREFERRED EMBODIMENTS

Embodiments of the present invention will be described with reference to an accompanying drawings.

Figure 7:
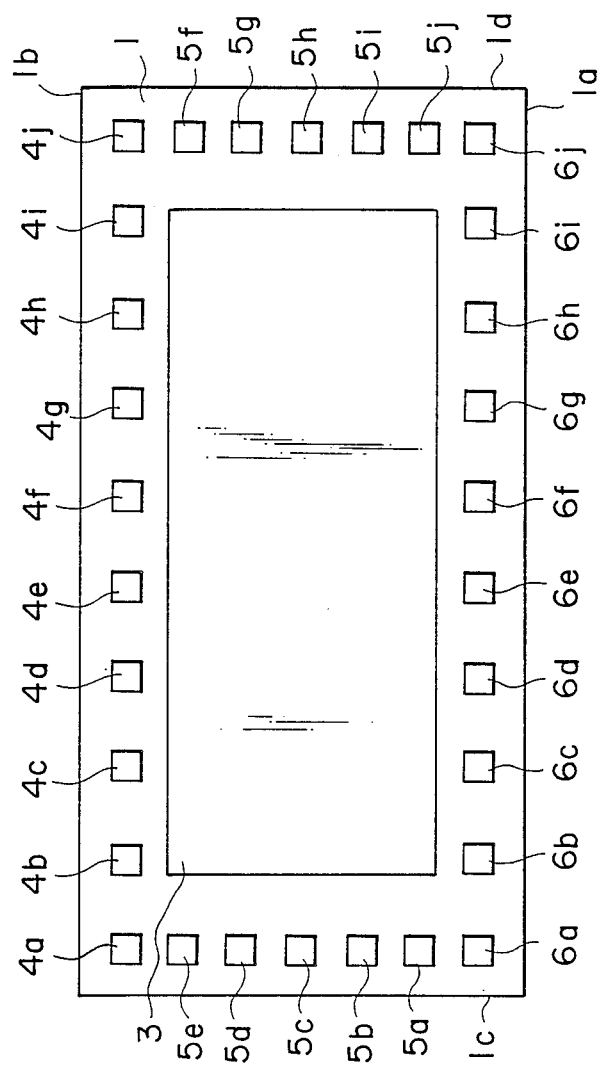
FIG. 7 is a plan view of an embodiment of the semiconductor device in accordance with the present invention.

Referring to FIG. 7, a circuit region 3 is formed on the center of a rectangular semiconductor substrate 1. The semiconductor substrate 1 has a pair of longitudinal sides 1a and 1b. A first group of bonding pads 6a to 6j are arranged in a row along one side 1a of the longitudinal sides of the semiconductor substrate 1, while a second group of bonding pads 4a to 4j are arranged in a row along the other longitudinal side 1b of the semiconductor substrate 1. Furthermore, a third group of bonding pads 5a to 5e and a fourth group of bonding pads 5f to 5j are arranged along one and the other of a pair of shorter sides 1c and 1d, respectively, of the semiconductor substrate 1.

Among the bonding pads 4a to 4j of the second group, the bonding pads 4a to 4e, i.e., half of the total of pads 4a to 4j, adjacent to the shorter side 1c of the semiconductor substrate 1 correspond to the bonding pads 5a to 5e of the third group respectively, and the bonding pads having the same suffixes handle the same signals. The remaining half 4f to 4j of the second group, i.e., those bonding pads which are located adjacent to the other shorter side 1d, correspond to bonding pads 5f to 5j of the fourth group, and the corresponding bonding pads having the same suffixes handle the same signals. The bonding pads 4a to 4j of the second group and the bonding pads 5a to 5j of the third and fourth groups are selectively and electrically connected to the circuit region 3 in accordance with a specification of the package in which this semiconductor device is encapsulated. The bonding pads 6a to 6j of the first group are connected to the circuit region 3 regardless of the specification of the package.

Figure 8A:
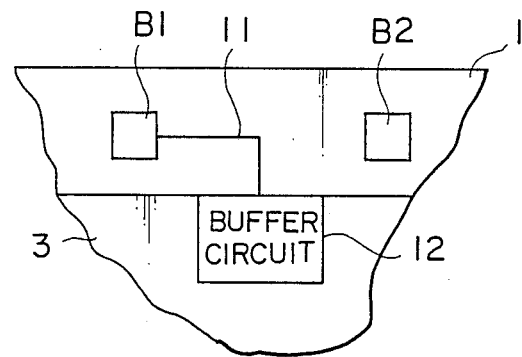
FIGS. 8A and 8B are fragmentary plan views illustrating the states of connection between corresponding bonding pads and a circuit region.
Figure 8B:
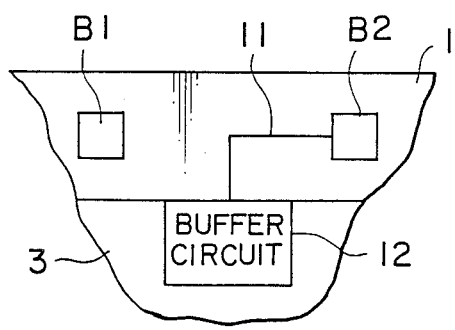

Either one of the corresponding bonding pads for the same signals is selectively connected to the circuit region 3 at the time of formation of the wiring pattern of the semiconductor device, in a manner shown in FIGS. 8A and 8B. In these Figures, corresponding bonding pads for handling the same signal are represented by B1 and B2. The formation of the wiring pattern on the semiconductor substrate 1 is conducted by selectively using one of two types of mask patterns: namely, a mask pattern for forming internal wiring 11 which provides, as shown in FIG. 8A, connection between an internal buffer circuit 12 formed in the circuit region 3 and one B1 of the bonding pads, and another mask pattern designed to form an internal wiring 11 which provides, as shown in FIG. 8B, a connection between the internal buffer circuit 12 and the other B2 of the bonding pads. By selectively using one of these mask patterns in accordance with the specification of the package, a wiring pattern of, for example, A1 is formed on the semiconductor substrate 1 so that one of the pair of bonding pads B1 and B2 is selectively connected to the internal buffer circuit 12.

Figure 9A:
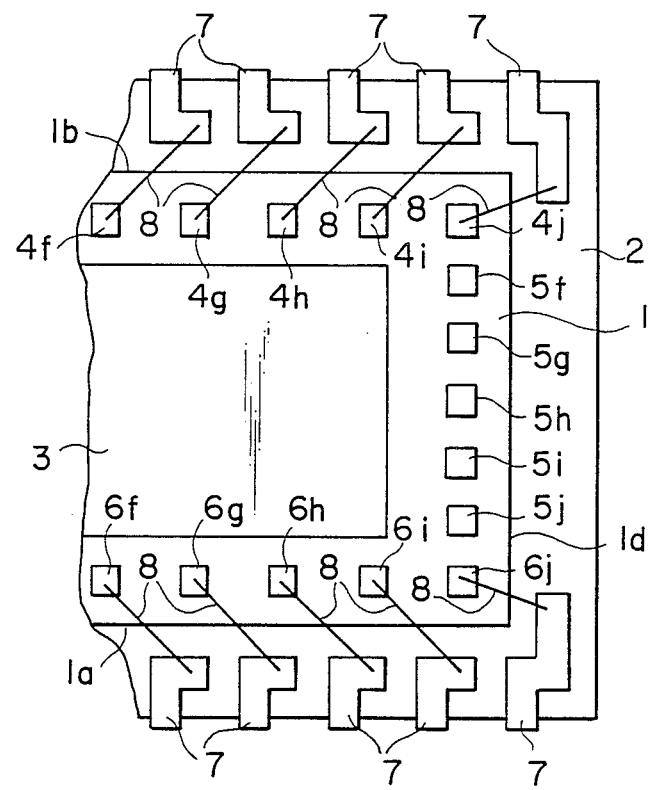

Thus, the semiconductor device can be produced in which the bonding pads 4a to 4j of the second bonding pad group shown in FIG. 7 are connected to the circuit region 3 while the bonding pads 5a to 5j constituting the third and fourth groups are isolated from the circuit region 3. In this case, only the bonding pads arranged along the longitudinal sides 1a and 1b of the semiconductor substrate 1 are used for the bonding purpose, so that the semiconductor device thus obtained is suited to packaging in an SOJ. FIG. 9A is a fragmentary plan view of an arrangement which is obtained by packaging this semiconductor device in a 20-pin SOJ. It will be seen that the bonding pads 6a to 6j and 4a to 4j of the first and the second groups arranged along the longitudinal edges 1a and 1b of the semiconductor substrate 1 are connected to corresponding leads 7 through bonding wires 8. With this arrangement, the bonding pads arranged along the shorter sides 1c and 1d are not used for the bonding purpose so that it is not necessary to increase the length of the package at the portions between the ends thereof and the shorter sides 1c and 1d of the semiconductor substrate 1, thus enabling a semiconductor substrate 1 of a greater size to be mounted.

The semiconductor device also may be formed such that the bonding pads 5a to 5j constituting the third and fourth groups shown in FIG. 7 are connected to the circuit region 3, while the bonding pads 4a to 4j of the second group are isolated from the circuit region 3. In this case, bonding is accomplished by using only the bonding pads arranged along one of the longitudinal sides 1a, 1b of the semiconductor substrate 1 and the bonding pads which are arranged along the pair of shorter sides 1c and 1d. The thus obtained semiconductor device is suited to packaging in a ZIP. FIG. 9B is a fragmentary plan view of an arrangement which is obtained by packaging this semiconductor device in a 20-pin ZIP. It will be seen that the bonding pads 6a to 6j arranged along one of the longitudinal sides 1a of the semiconductor substrate 1 and the bonding pads 5a to 5j constituting the third and fourth groups are connected to corresponding leads 7 through bonding wires 8. In this case, bonding pads arranged along the other longitudinal edge 1b of the semiconductor substrate 1 are not used for the bonding purpose, thus eliminating any necessity for the height of the package to be increased in the portion thereof near the longitudinal side 1b of the semiconductor substrate 1, thereby allowing a semiconductor substrate 1 of a greater area to be packaged in a ZIP.

Figure 10A:
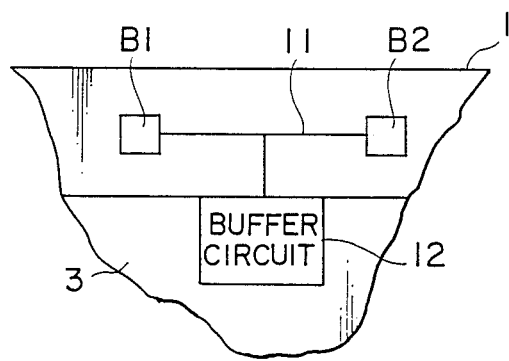
FIGS. 10A to 10C are fragmentary plan views showing the manners in which corresponding bonding pads are connected to a circuit region in another embodiment of the present invention.

The semiconductor device according to the present invention may also be formed by connecting both of the corresponding bonding pads B1 and B2 to an internal buffer circuit 12 of the circuit region 3 through internal wiring 11 as shown in FIG. 10A and then cutting suitable portions of the internal wiring 11.

Figure 10B:
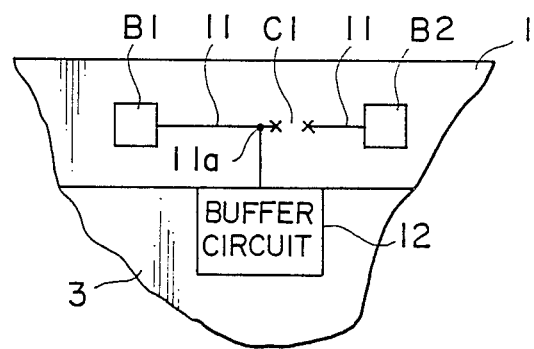
Figure 10C:
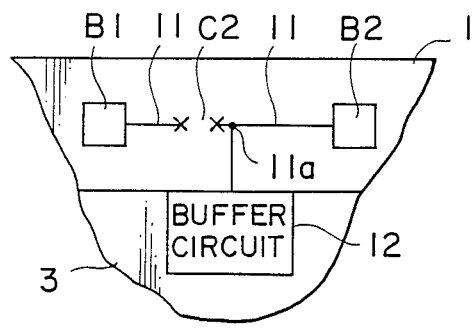

For instance, in the arrangement shown in FIG. 10B, the internal wiring 11 is cut at a point C1 which is between a node 11a of the internal wiring 11 and the bonding pad B2. In the semiconductor device thus produced, only the bonding pad B1 is connected to the internal buffer circuit 12, while the bonding pad B2 is isolated. Conversely, when the internal wiring 11 is cut at a point C2 which is between the node 11a of the internal wiring 11 and the bonding pad B1 as shown in FIG. 10C, a semiconductor device is obtained in which only the bonding pad B2 is connected to the internal buffer circuit 12, while the bonding pad B1 is isolated. The cutting of the internal wiring 11 may be effected by, for example, applying a laser beam to the internal wiring 11 which is made of, for example, an Al wire.

Figure 1A:
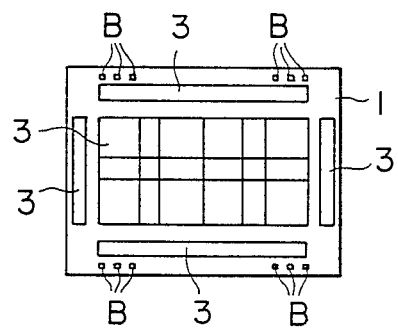
FIG. 1A is a plan view of a known semiconductor device.
Figure 1B:
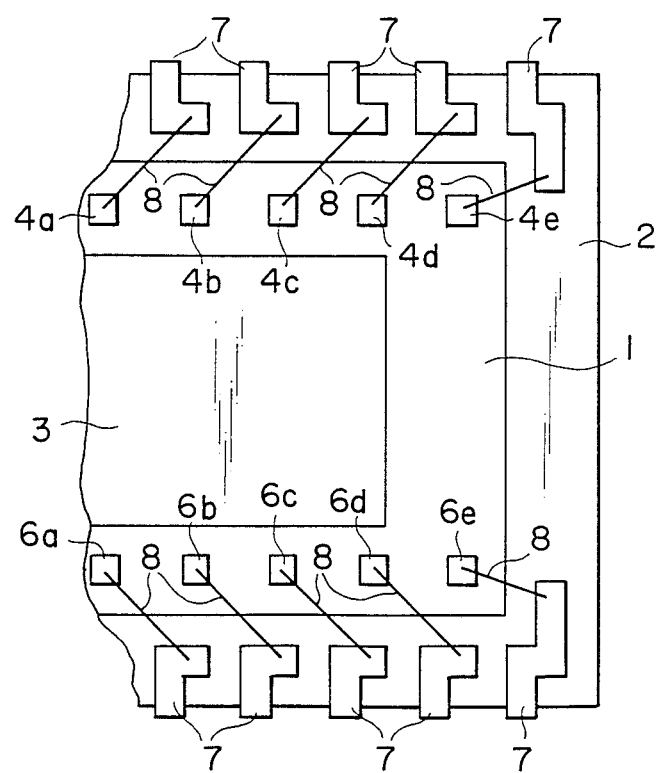
Figure 2A:
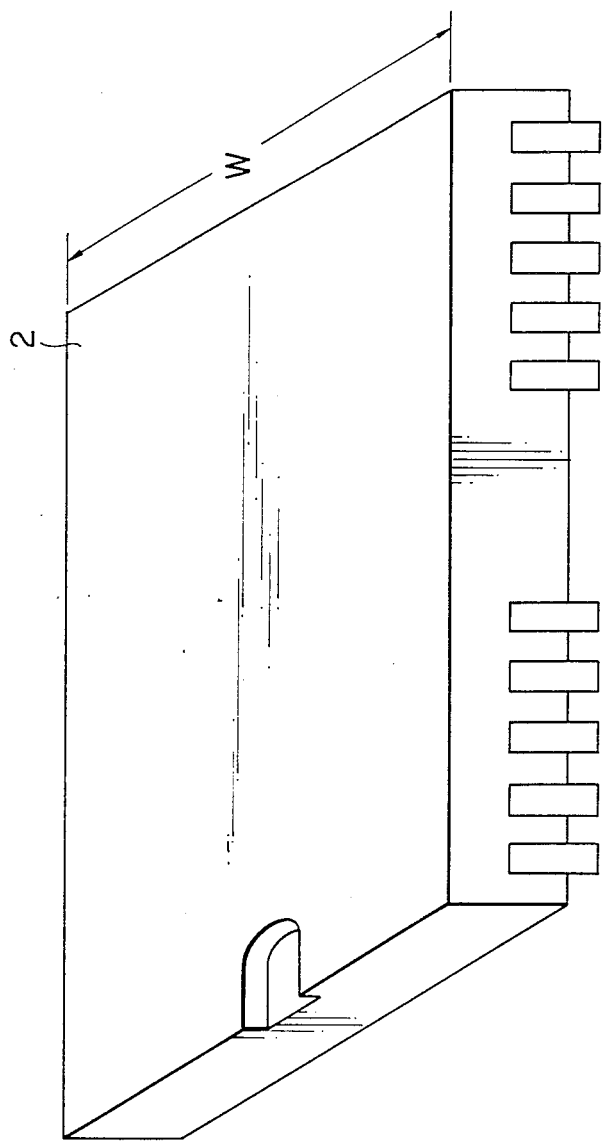
FIGS. 2A and 2B are perspective views of an SOJ and a ZIP, respectively.
Figure 2B:
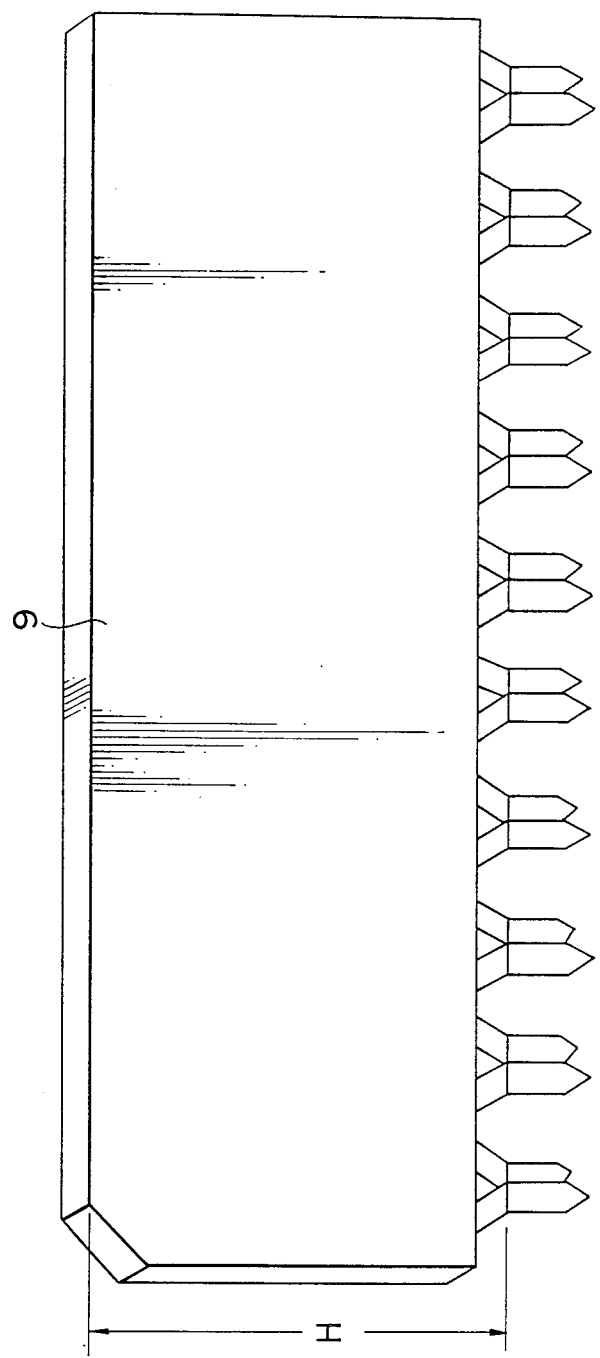
Figure 3A:
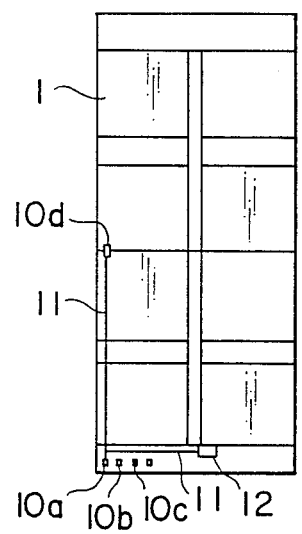
FIG. 3A is a plan view of another known semiconductor device.
Figure 3B:
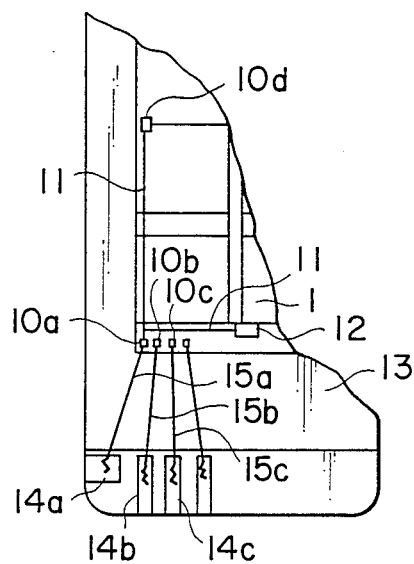
FIGS. 3B and 3C are fragmentary plan views of arrangements obtained by mounting the semiconductor device of FIG. 3A in a ceramic package and a plastic package, respectively.
Figure 3C:
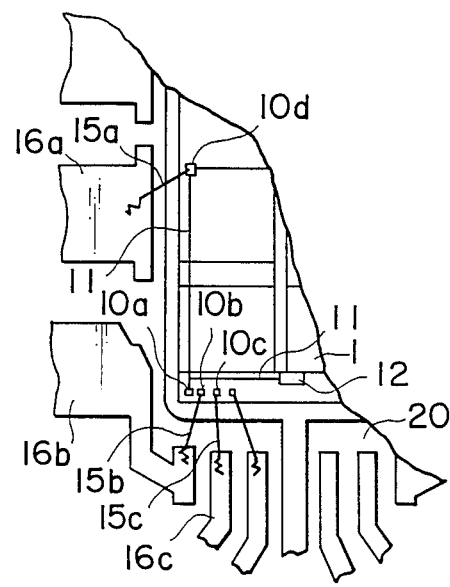
Figure 4:
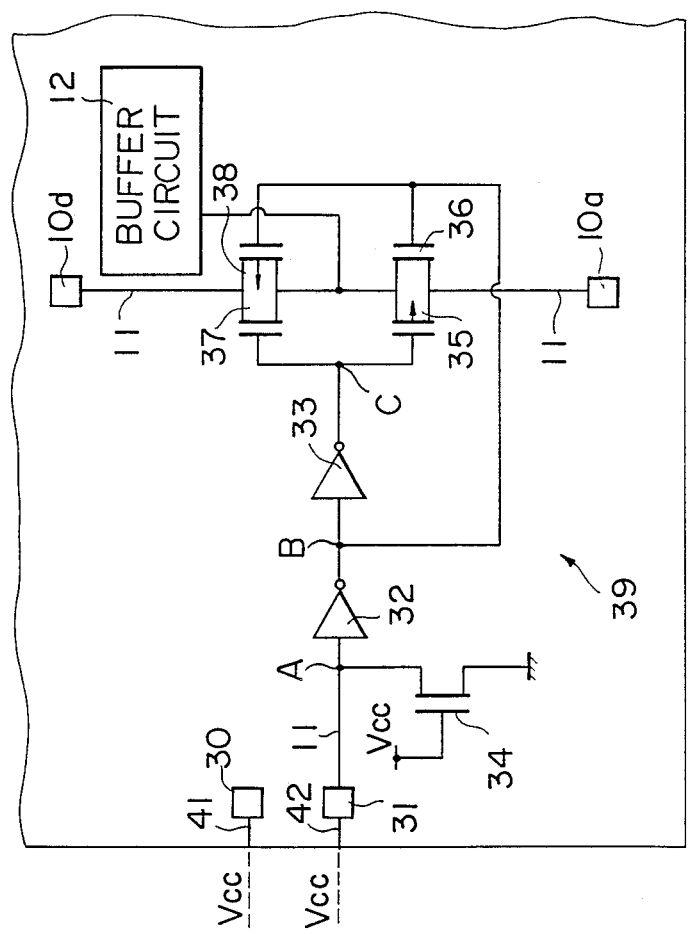
FIG. 4 is a circuit diagram showing a known bonding pad switching means.
Figure 5A:
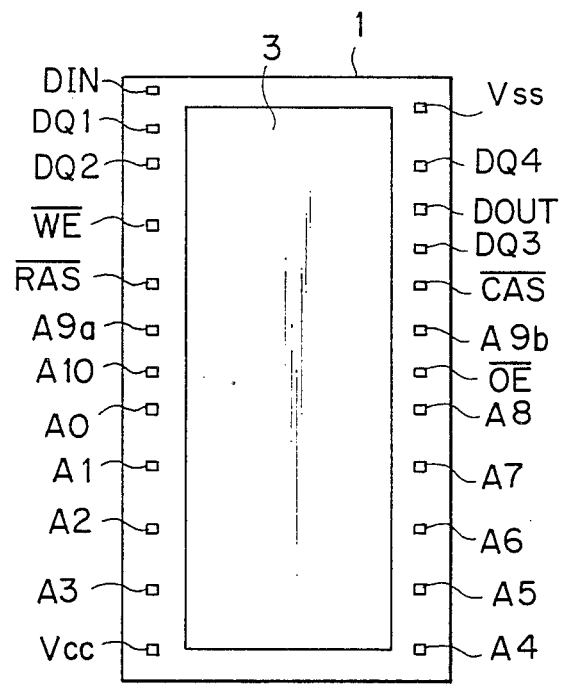
FIG. 5A is a plan view of still another known semiconductor device incorporating the switching means shown in FIG. 4.
Figure 5B:
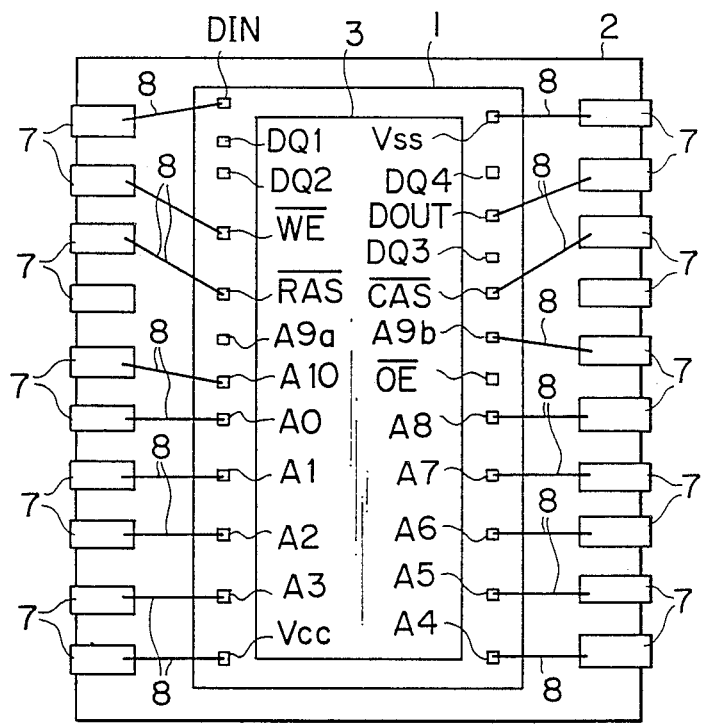
FIGS. 5B and 5C are plan views of arrangements obtained when the semiconductor device of FIG. 5A is packaged in an SOJ.
Figure 5C:
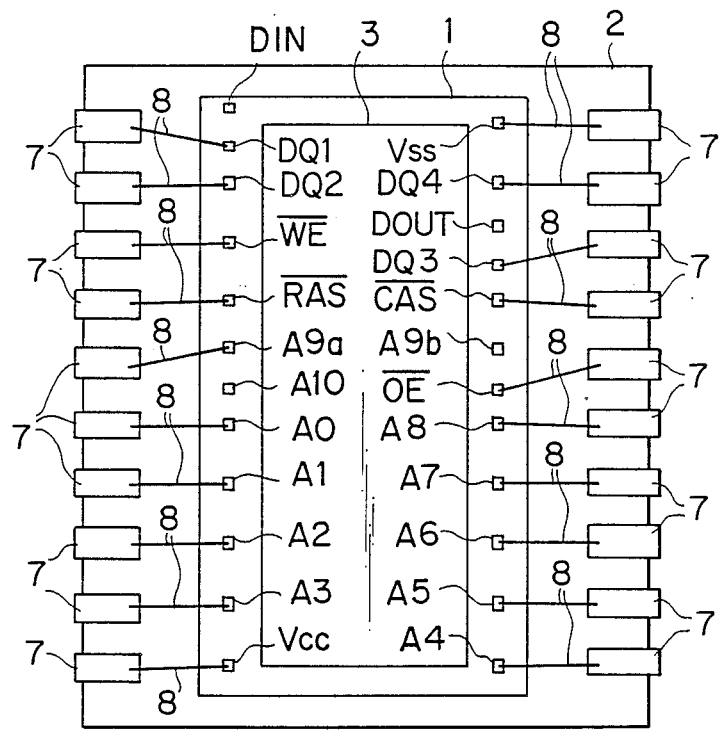
Figure 6A:
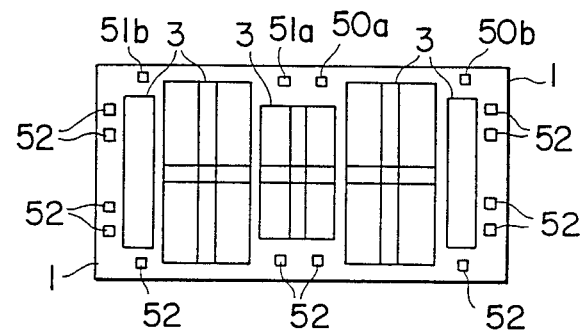
FIG. 6A is a plan view of a further known semiconductor device.
Figure 6B:
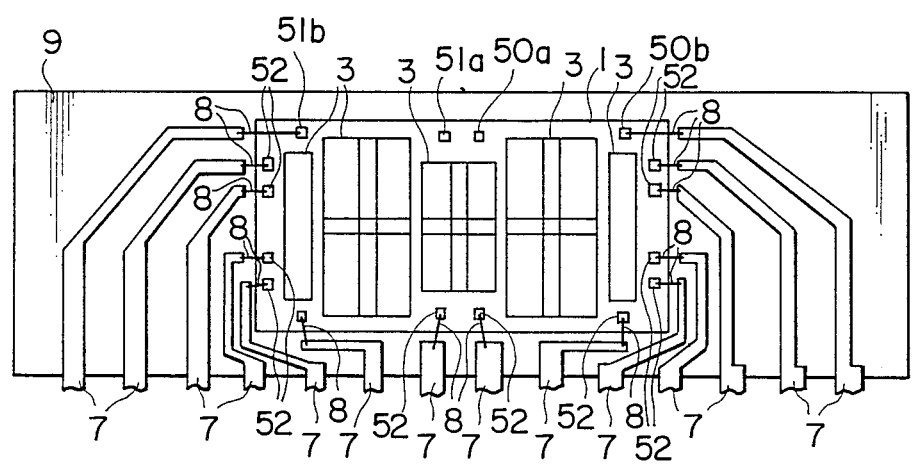
FIGS. 6B to 6D are plan views obtained when the semiconductor device of FIG. 6A is packaged in a ZIP, a DIP and an SOJ, respectively.
Figure 6C:
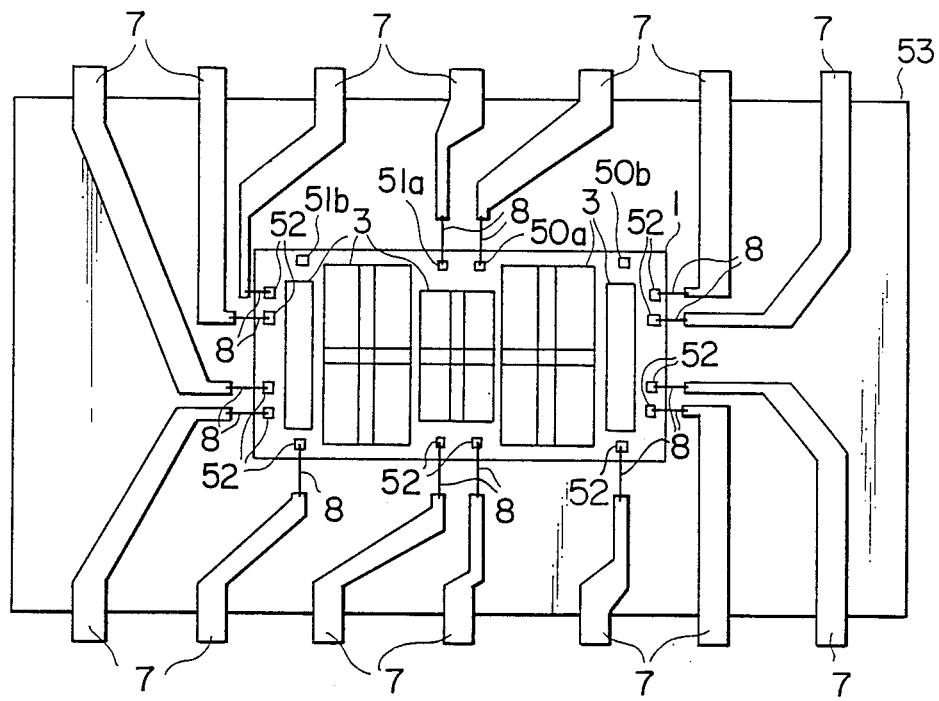
Figure 6D:
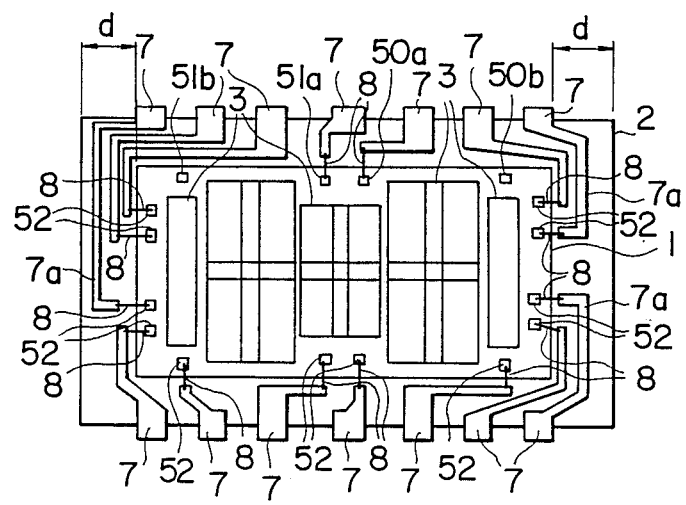

A similar effect can be produced by using the connection switching means of the type shown in FIG. 4 for each pair of the bonding pads.

It is to be understood, however, the selection of the connection of the bonding pads by means of the wiring patterns as shown in FIGS. 8A, 8B and FIGS. 10A to 10C enables an easy switching of the bonding pads by a simple arrangement, without requiring the use of exclusive elements and wires for the switching of the connection.

Although the invention has been described with specific reference to the cases where the semiconductor device of the invention is packaged in a 20-pin SOJ or a 20-pin ZIP, it is to be understood that the described arrangements are only illustrative and the semiconductor device of the invention can be suitably encapsulated both in packages of specifications which require lead terminals to be provided only on one of opposing longitudinal sides of the packages and in packages of specifications which require lead terminals to be provided on both of the longitudinal sides of the packages.

In the above-described embodiments, the rectangular semiconductor substrate 1 is used. The semiconductor substrate 1 may, however, have shapes other than rectangle which has a first pair of two opposing sides and a second pair of two opposing sides.

What is claimed is:

1. A packagable semiconductor device comprising:
a semiconductor substrate having first, second, third, and fourth sides, said first and second sides opposing each other and said third and fourth sides opposing each other;
a circuit formed on said semiconductor substrate; and
first, second, third, and fourth groups of bonding pads respectively arranged along said first, second, third, and fourth sides of said semiconductor substrate, respectively, each group including at least two bonding pads, wherein the bonding pads of said first group are electrically connected to said circuit, each of the bonding pads of said third and fourth groups having a corresponding bonding pad in said second group, the respective corresponding bonding pads being alternatively employable for establishing the same connection to said circuit, one of each of the respective corresponding bonding pads being selectively electrically connectable to said circuit to meet a selected one of at least two different specifications for package size and terminal configuration.

2. A packagable semiconductor device according to claim 1 wherein the bonding pads of only said first and second groups are electrically connected to said circuit to meet a first specification for package size and terminal configuration.

3. A package semiconductor device according to claim 1 wherein the bonding pads of only said first, third, and fourth groups are electrically connected to said circuit to meet a second specification for package size and terminal configuration.

4. A packagable semiconductor device according to claim 1 wherein said semiconductor substrate is rectangular, said first and second sides being the longer sides.

5. A packagable semiconductor device according to claim 1 including wiring disposed on said semiconductor substrate wherein the bonding pads of said second group and the corresponding bonding pads of said third and fourth groups are selectively electrically connectable to said circuit through said wiring.

* * * * *

UNITED STATES PATENT AND TRADEMARK OFFICE
CERTIFICATE OF CORRECTION

PATENT NO. : 4,974,053

DATED : November 27, 1990

INVENTOR(S) : Kinoshita et al.

It is certified that error appears in the above-identified patent and that said Letters Patent is hereby corrected as shown below:

Column 8, line 38, change "package" to --packagable--.

Signed and Sealed this

Nineteenth Day of May, 1992

Attest:

DOUGLAS B. COMER

Attesting Officer

Acting Commissioner of Patents and Trademarks